United States Patent [19]

Stengl et al.

[11] Patent Number: 5,693,950
[45] Date of Patent: Dec. 2, 1997

[54] PROJECTION SYSTEM FOR CHARGED PARTICLES

[75] Inventors: Gerhard Stengl, Wernberg; Alfred Chalupka, Vienna; Herbert Vonach, Klosterneuberg, all of Austria

[73] Assignee: IMS-Ionen Mikrofabrikations Systeme GmbH, Vienna, Austria

[21] Appl. No.: 666,495

[22] PCT Filed: Jan. 12, 1995

[86] PCT No.: PCT/AT95/00004

§ 371 Date: Sep. 3, 1996

§ 102(e) Date: Sep. 3, 1996

[87] PCT Pub. No.: WO95/19640

PCT Pub. Date: Jul. 20, 1995

[30] Foreign Application Priority Data

Jan. 13, 1994 [AT] Austria ............................. 46/94

[51] Int. Cl.$^6$ ................... H01L 21/266; H01L 21/263; H01J 37/30; H01J 37/317
[52] U.S. Cl. .................. 250/492.21; 250/492.23; 250/251
[58] Field of Search ............. 250/492.21, 492.23, 250/251

[56] References Cited

U.S. PATENT DOCUMENTS

| | | | |
|---|---|---|---|
| 4,804,837 | 2/1989 | Farley | 250/251 |
| 4,894,549 | 1/1990 | Stengl | 250/492.21 |
| 5,378,899 | 1/1995 | Kimber | 250/492.21 |

OTHER PUBLICATIONS

Weidenhausen et al., Stochastic Ray Deflections In Focused Charged Particle Beams, Optik 69, No. 3 (1985) 126–134.

A. Yanof, "Electron–Beam, X–Ray, and Ion–Beam Technology: Submicrometer Lithographies VIII", SPIE, vol. 1089 (1989).

*Primary Examiner*—Jack I. Berman
*Attorney, Agent, or Firm*—Kenyon & Kenyon

[57] ABSTRACT

A charged particle, in particular ion projector system, has a mask arranged in the path of the charged particle beam and provided with transparent spots, in particular openings, arranged asymmetrically to the optical axis, which are reproduced on a wafer by means of lenses arranged in the path of the charged particle beam. The charged particle beam has at least one cross-over (crosses the optical axis at least once) between the mask and the wafer. Charged particles with an opposite charge to the charge of the reproduction particles are supplied into the path of the reproduction charged particle beam in a defined area located between the mask and the wafer. The limits that define said area are selected in such a way that the absolute value of the integral effect of the space charge on the particles that reproduce the mask structures is as high upstream of said area (seen in the direction of radiation) as the absolute value of the integral effect of the space charge downstream of said area.

12 Claims, 6 Drawing Sheets

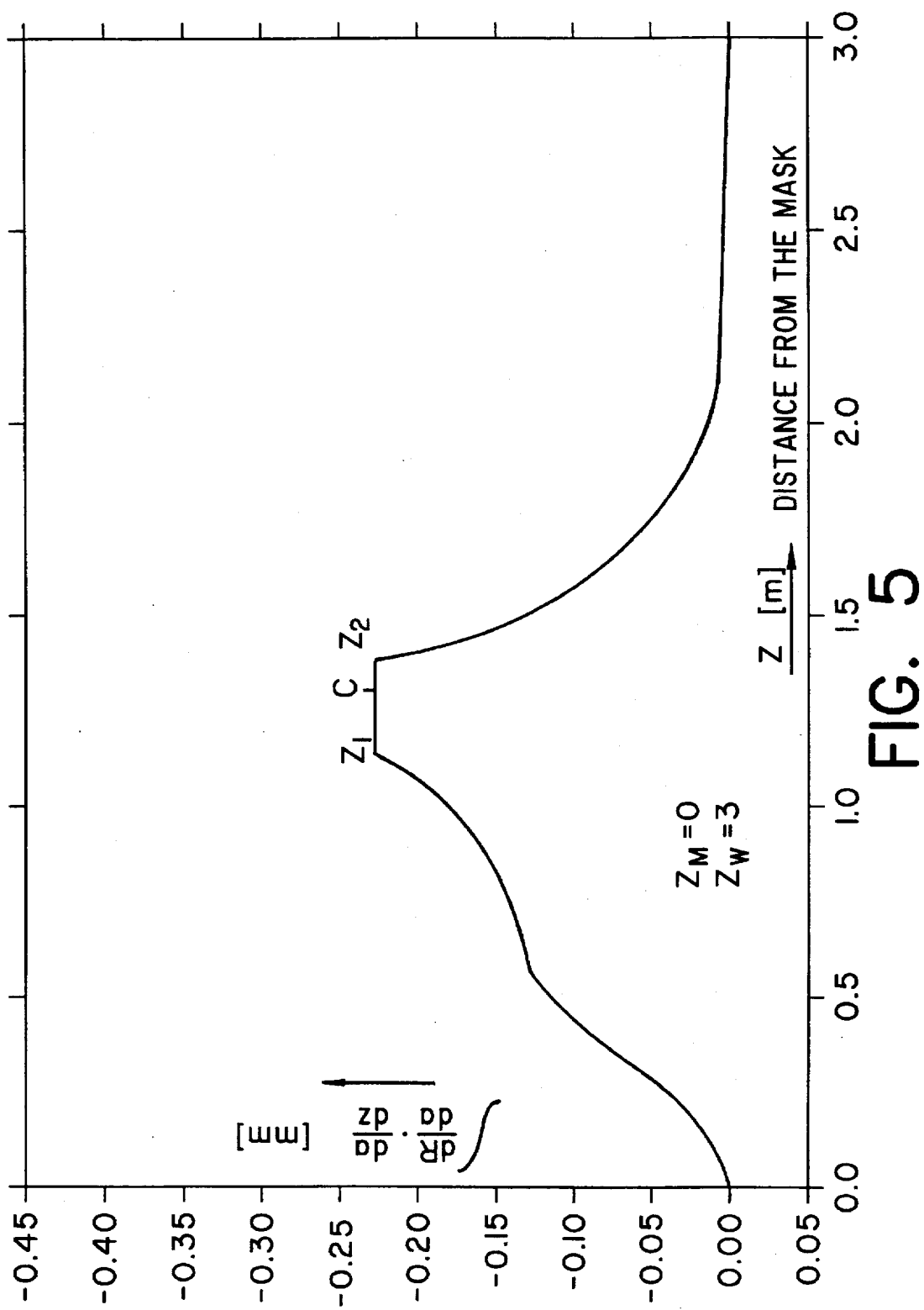

PROJECTION SYSTEM FOR CHARGED PARTICLES

FIELD OF THE INVENTION

The invention relates to a projection system for charged particles, in particular ions, having a mask disposed in the beam path of charged particles which mask comprises transparent portions, more specifically holes, which are disposed in a particular asymmetrical manner with respect to the optical axis and which are imaged onto a wafer using lenses disposed in the beam path of the charged particles, wherein the beam of the charged particles comprises between the mask and the wafer at least one cross-over (crosses the optical axis).

BACKGROUND INFORMATION

In the case of the projection systems of this type, problems occur owing to the fact that in the case of identical current density at the mask provided with the transparent portions, depending upon the mask and arrangement and also the size of the transparent portions, different ionic currents and current density distributions occur behind the mask. The so-called space-charge effect, which occurs owing to the mutual influencing of the charged particles once they have passed through the transparent portions of the mask, causes the charged particles to be deflected differently, thus causing the charged particles to impact on the wafer at impact locations (actual impact locations) which differ from the desired impact location which can produce scale changes and image distortions.

These problems are particularly serious if the transparent portions in the mask are disposed in an extreme asymmetric manner with respect to the optical axis. In order to solve the ensuing problems it has already been proposed (image Projection Ion-Beam Lithography by Paul A. Miller in SPIE Vol, 1089 Electron-Beam, X-ray, and Ion-Beam Technology Submicrometer Lithographies VII I (1989), pages 26 and following) to attach compensating holes (or rather transparent regions) in the mask in order to achieve an arrangement of transparent regions (holes) which create an arrangement of transparent regions (holes) which are symmetrical with respect to the ionic-optical axis.

A disadvantage of these aforementioned features resides in the fact that the total current increases and thus the effect of the so-called stochastic space charge, which is based on the direct Coulombian interaction of the randomly distributed ions, is increased, resulting in the maximum achievable resolution being impaired. The stochastic space charge is according to A. Weidenhausen, R. Spehr, H. Rose, Optics 69, Page 126–134, 1985 proportional to the quadratic root of the total current.

Apart from this disadvantage, it is also difficult to calculate the size and arrangement of the transparent regions which are arranged on the mask and assist in the compensating process.

SUMMARY OF THE INVENTION

In order to provide a solution to the problem mentioned in the introduction and to avoid problems which occur in the arrangement of the transparent regions which assist in the compensating process, the invention proposes in the case of a projection system for charged particles to provide between the mask and the wafer a dispenser of particles which are oppositely charged with respect to the particles being imaged, e.g. a thermionic cathode, for projection systems which operate with positively charged ions, for the purpose of directing oppositely charged particles into the beam path of the charged particles. Apart from positive ions, the projection system embodying the invention can also be used to project electrons or to project negative ions, more specifically negative hydrogen ions. These negative ions render possible a more convenient mass separation.

The electrically charged particles which are to be directed between the mask and the wafer are oppositely charged with respect to the particles of the main beam. If the imaging particles are positively charged ions, then electrons are used as oppositely charged particles. If the imaging particles are negatively charged ions, more specifically negative H-ions, then the oppositely charged particles are positively charged ions. If electrons are used as the imaging particles, then the oppositely charged particles are positively charged ions. The particles charged oppositely to the charge of the particles of the main stream are directed in a region whose boundaries are defined by the requirement that the absolute amount of the integral effect of the space charge on the particles imaging the mask structures, as seen in the beam direction, before this region is identical in size to the absolute amount of the integral effect of the space charge after this region.

For simplification purposes, it is assumed hereinunder that the imaging particles (main stream) are positively charged ions and that electrons are used as particles for the space charge compensation.

It is not necessary for projection systems comprising a cross-over between mask and wafer to direct electrons in the entire region between the mask and wafer since the effect before and after the cross-over is partially compensated. Since the space charge effect is greater, the closer the ions are to each other, it is most favourable to direct the electrons in the region around the cross-over.

In a further embodiment of the invention it is possible for the purpose of defining the region in which the neutralising particles are directed to provide on each side of the region, preferably on both sides of the cross-over, at least one diaphragm which is connected to a voltage source and whose hole allows the passage of any beam of rays which contains the image information originating from the transparent portions of the mask. Between the diaphragms there is, necessitated by the potentials which impinge on the diaphragm, a cage for the electrons, which cage substantially prevents the electrons from escaping outwards so that they can be utilised to their full effectiveness.

A series of diaphragms can be disposed in each case on both sides of the cross-over. The potential on these diaphragms can be changed, whereby the defined region for the supply of the charged particles for the compensation of the space charge can be varied. The holes of the diaphragms can be different, in such a manner that the diaphragms closest to the cross-over comprise a smaller hole than those further away from the cross-over. The size of the diaphragm holes is however, as already mentioned, to be tailored to suit the cross-section of the beam of rays which contains the image information originating from the mask in order to transfer the full contents of the image information onto the wafer.

The electron dispenser can be e.g. a LaB6 cathode, for example an indirectly heated LaB6 cylinder which encompasses the ion beam. Or low energy secondary electrons are generated with the aid of an electron canon which emits in particular 1 keV electrons through an hole onto the inner wall of a metallic, especially cylindrical screen which encompasses the beam and which secondary electrons neutralise the ion beam.

As already mentioned, an electrically charged particle (e.g. an ion), which passes through a mask hole, is subjected to the influence of a field which is induced by the other ions which move in the direction towards the wafer plane in the particle-optical column. In the case of a space charge which is initially assumed to be radially symmetrical the additional field produced by the space charge has an overall purely radial effect. A charged particle which without the space charge effect would arrive at the wafer in the distance $R_1$ Azimuth $\phi$ will therefore when taking into consideration the space charge arrive at the wafer at the identical Azimuth $\phi$ but in a predetermined distance $\Delta R$ from the desired impact location.

The deviation $\Delta R$ can be expressed mathematically as follows:

$$\Delta R = \int_{Z_m}^{Z_w} \frac{dR}{d\alpha}(Z) \cdot \frac{d\alpha}{dz}(Z) \cdot dz. \tag{1}$$

In the equation (1) $Z_w$ represents the coordinate of the wafer plane, $Z_m$ the coordinate of the mask plane, $\alpha$ represents the respective angle of the particle path with the optical axis in the z-direction (propagation of the beam), $dR/d\alpha$ represent the change of the beam position in the wafer plane owing to the angle change at the location z, $d\alpha/dz$ represent the change in beam direction along the particle-optical axis (z-direction) caused by the space charge.

Assuming that the ratio of the radial distances of the respective two ion paths along the optical axis remains constant and that the speed component in the z-direction $V_z(Z)$ is identical for all ions, that therefore—in other words—the effective charge quantity for each particle along its path is always the same size, then the following analytic expression is produced for the angle change $d\alpha/dz$ caused by the space charge:

$$\frac{d\alpha}{dz} = C \cdot \frac{1}{r(z) \cdot v_z^3(z)} \tag{2}$$

with $\alpha = v_r/v_z$, wherein $v_r$ and $v_z$ are the speed components of the particles in r- and z- direction. The value of this function for any z can be determined with the aid of trajectory calculations. The change of the beam position dR on the wafer plane owing to an angle change $d\alpha$ at the location z, $dR/d\alpha(Z)$, can likewise be determined by means of trajectory calculations, in that at a sufficient number of z-positions the calculation is interrupted, a slight angle change $\Delta\alpha$ superimposed and then the calculation is continued until as far as the wafer plane.

Equation (2) shows that in the environment of the cross-over it is not applicable to assume a constant effective charge quantity for each ion since in the cross-over point, i.e. where $r(z)=0$, the value for $d\alpha/dz$ would become infinitely great. In actual fact, lens systems never comprise a sharp cross-over point, which means that equation (2) is not valid for the environment of the cross-over point. If, however, sufficient negatively charged particles, e.g. electrons, are directed in the region of the cross-over, then in this region the effect of the space charge is equal to zero. It is therefore not necessary to take into consideration this region when calculating the integral of the equation (1).

By providing a sufficient number of electrons it is possible to compensate the space charge in a region $Z_1<Z<Z_2$. Diaphragms are disposed at locations with the coordinates $Z_1$ and $Z_2$ before or after the coordinate $Z_2$ of the cross-over, which diaphragms are negatively biased in order to ensure that no electrons can leave the region lying between $Z_1$ and $Z_2$ around the cross-over. Since the operating sign of $dR/d\alpha$ inverts after the cross-over and with respect to neutralising the space charge between $Z_1$ and $Z_2$, equation (1) can be described as follows:

$$\Delta R \cdot \left| \int_{Z_m}^{Z_1} \frac{d\alpha}{dz} \cdot \frac{dR}{d\alpha} \cdot dz \right| = \left| \int_{Z_2}^{Z_w} \frac{d\alpha}{dz} \cdot \frac{dR}{d\alpha} \cdot dz \right|. \tag{3}$$

The coordinates $z_1$ and $z_2$ for the diaphragms are now selected so that the absolute amount of the two integrals of equation (3) is identical, in which case the deviation $\Delta R$ disappears.

This compensation of the space charge effect is, however, not limited to the radially symmetrical space charge distribution.

In the case of an optional distribution of the mask holes the space charge field for a predetermined particle charge comprises both a radial and also an azimuthal component. The particle is therefore deflected by the space charge radially by $\Delta R$ and azimuthally by the angle $\Delta\phi$ and the distance $R\Delta\phi$.

Equation (1) continues to apply for the radial change $\Delta R$, and for the azimuthal deflection $\Delta\phi$ $$\Delta\phi = \int_{Z_m}^{Z_w} \frac{d\phi}{d\beta}(z) \cdot \frac{d\beta}{dz}(Z) \cdot dz \tag{4}$$

analogously applies.

In so doing, $d\phi/d\beta$ represents the azimuthal position change at the location of the wafer as a result of the beam direction change $\beta$, perpendicular to the main section (plane through the particle location and optical axis), caused by the space charge and $d\beta/dz$ represents the change of angle $\beta$ per unit length caused by the space charge. The variables $dR/d\alpha$ and $d\phi/d\beta$ and $d\alpha/dz$ and $d\beta/dz$ are associated with each other in a convenient manner.

In the case of a rotationally symmetrical lens small angle changes $\Delta\alpha$ and $\Delta\beta$ in the main section and perpendicular thereto produce in the first order always identical deflections $\Delta R$ and $R\Delta\phi$, i.e. always:

$$\frac{dR}{d\alpha} = R \cdot \frac{d\phi}{d\beta}(Z) \tag{5}$$

for any values of Z.

Likewise $d\alpha/dz$ and $d\beta/dz$ are associated with each other in an extremely convenient manner, if again there is the prerequisite that the ratio of the radial distances of the two respective undisturbed ion paths remain constant along the optical axis and there is the additional prerequisite that the undisturbed ion paths constantly extend in the main section (which prerequisite is extremely well fulfilled in the case of the also pointshaped ion sources). A similar charge distribution is then obtained for each plane perpendicular to the optical axis and thus for a predetermined ion path always a space charge field for the identical direction, which can be broken down at each location Z in the identical manner into a radial and azimuthal component. Thus, the following also applies:

$$\frac{d\beta}{dZ}(Z) = C \cdot \frac{d\alpha}{dZ}(Z) \tag{6}$$

wherein the constant C does not depend upon Z but rather is determined only by the form of the charge distribution i.e. by the distribution of the holes in the mask.

From equation (5) and (6) together with equation (1) and (4) it is evident that both for $\Delta R$ and also for $\Delta\phi$ a compensation of the space charge effects between suitably selected limits $Z_M$, $Z_1$ and $Z_2$, $Z_w$ occurs before and after the cross-over. Owing to equation (5) and (6) this compensating for $\Delta R$ and $\Delta\phi$ occurs at the same diaphragm positions $Z_1$, $Z_2$. An extremely slight deviation from this simultaneous compensation is merely caused by the astigmatism of the lenses used, which leads to slight deviations with respect to equation (5).

It is possible to achieve a precise match of the absolute amounts of the integrals in equation (3) and thus an exact compensation of the space charge effect only for a predetermined value of R, i.e. for a predetermined desired impact location of a particle beam passing through one mask hole onto the wafer plane. As it is not possible to set different values for $Z_1$ and/or $Z_2$ for different values of R, the location of the beam impinging on the wafer changes for all not fully compensated values of R with the current intensities used for the imaging. This change of position of the beam on the wafer dependent upon R means an additional distortion dependent upon the current. This can be explained by the changed paths of the ions in the lenses caused by the space charge, thus changing the effect of the lenses. This results in the compensation of the spherical lens fields no long matching the currentless case.

In a further design of the embodiment according to the invention the compensation of the spherical lens fields can be reproduced by changing in dependence upon the current the refractive powers of the lenses.

Calculations for an ion projection system (Austrian patent application A47/94 of the same applicant and identical date) have shown that by slightly changing the lens voltages the values of the distortion of the image can be made equal to the same values as in the theoretical "currentless" case (without space charging).

A compensation of the global space charge according to the method embodying the invention can be carried out even for the case that the cross-over is located within a lens and thus it is not possible in this region to supply in a controlled manner oppositely charged particles. Equation (2) then does not apply in the region of the cross-over and $d\alpha/dz$ must be determined in this region in a different way, e.g. by simulation calculation. However, as long as the neutralising limits $Z_1$ and $Z_2$ can be selected in such a manner that the two absolute amounts are identical in equation (3), according to equation (3) no change of the beam position at the wafer occurs as a result of the space charge.

BRIEF DESCRIPTION OF THE DRAWINGS

The invention is explained in detail with reference to the following drawings.

FIGS. 2 to 5 illustrate graphs of various functions for the region lying between the mask and wafer in the z-direction (propagation direction of the beam as ordinate axis) and FIGS. 6a and 6b illustrate the calculated progression of ion paths in the environment of the cross-over.

DETAILED DESCRIPTION OF THE INVENTION

Figure 1:
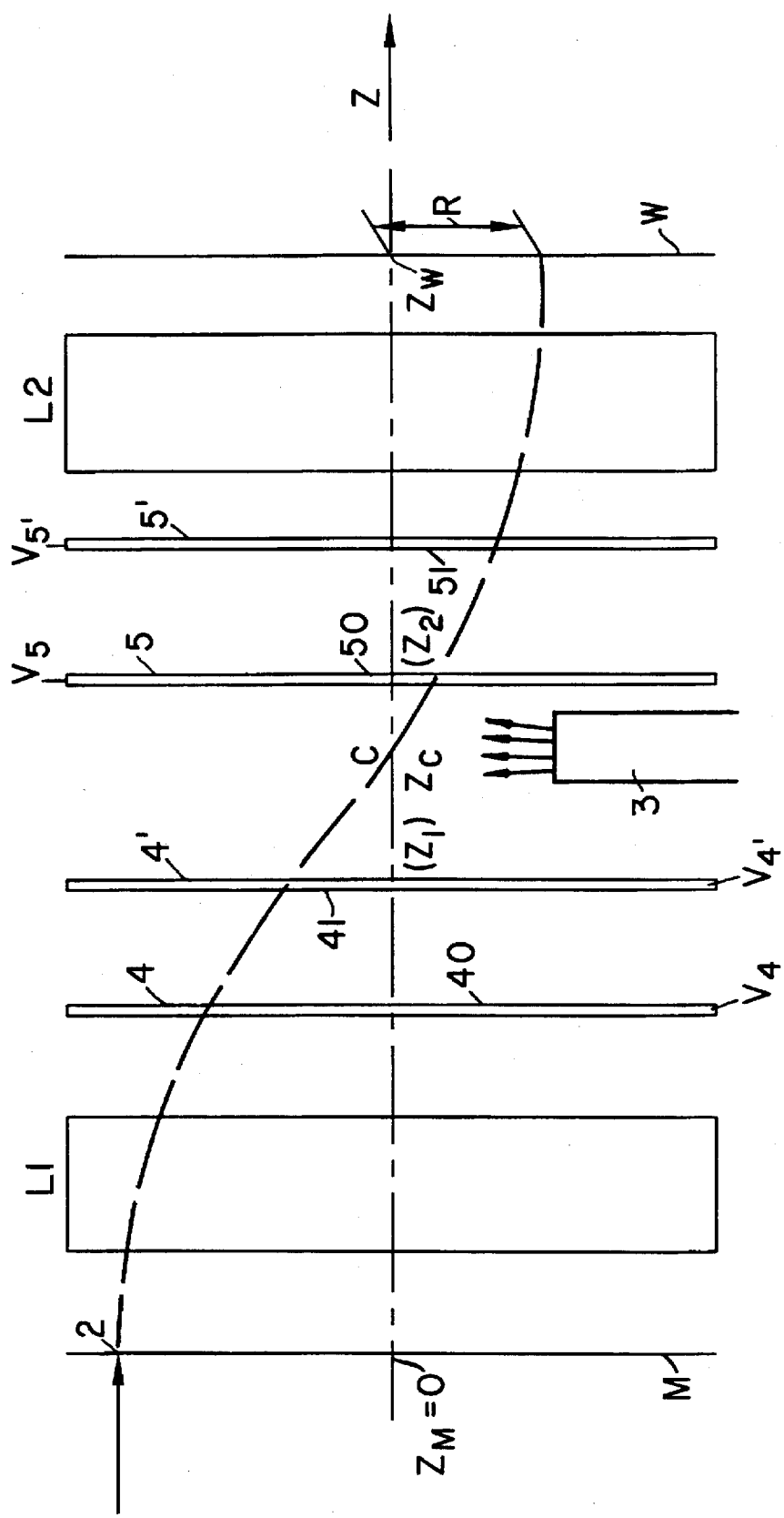
FIG. 1 shows a schematic sectional view of a projection system for charged particles between a mask and a wafer.

Referring to FIG. 1, the propagation direction of the particle beam is designated z, the mask M and the wafer W. $Z_M$ is the coordinate of the mask plane and $Z_w$ the coordinate of the wafer plane. The designation 1 describes the progression of a beam passing through an hole 2 in the mask M through two lenses L1 and L2 of the optical column. The designation C describes the cross-over, i.e. the point the beam crosses the ionic-optical (z-) axis. A device 3, which serves to introduce the compensation electrons into the beam path, is located in the region of the cross-over C.

The numerals 4 and 4' or 5 and 5' describe diaphragms this side and the other side of the cross-over C, which lie on potentials V4, V4' or V5 and V5'. The diaphragm holes 40, 41 or 50, 51 are to be selected of such a size that all beams which carry image information resulting from the different holes (transparent portions) in the mask M can pass unhindered. The potentials V4 to V5' are selected such that the electrons provided by the device 3 cannot escape from the region between the diaphragms 4' and 5 or 4 and 5'. R is the distance in which the beam passing through the hole 2 impacts onto the wafer plane after being deflected by the lens system L1 and L2. The illustration is based on the assumption that the space charge effect was fully compensated, i.e. $\Delta R$ disappears.

Figure 2:
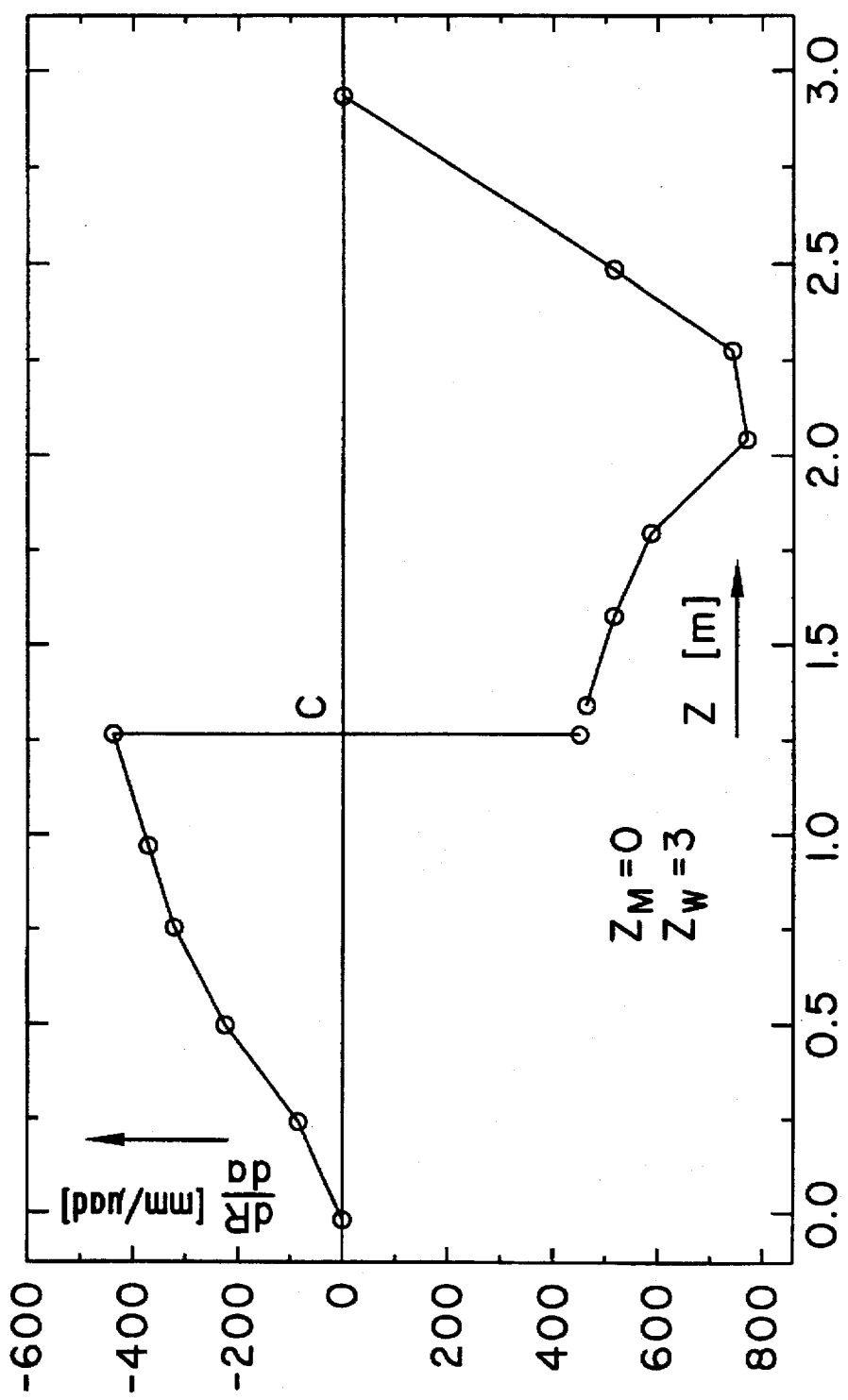

The graphs as shown in FIGS. 2 to 5 are based on an ion projector which uses as lenses three-electrode grating lenses, wherein high energy of approximately 100 keV occurs at the wafer. FIG. 2 illustrates the function $dR/d\alpha$ which reduces between the mask and the cross-over C, wherein the cross-over is located approximately 1.3 m after the mask. After the cross-over C the function changes its operational sign and in the wafer plane (3 m away from the mask M) becomes zero.

Figure 3:
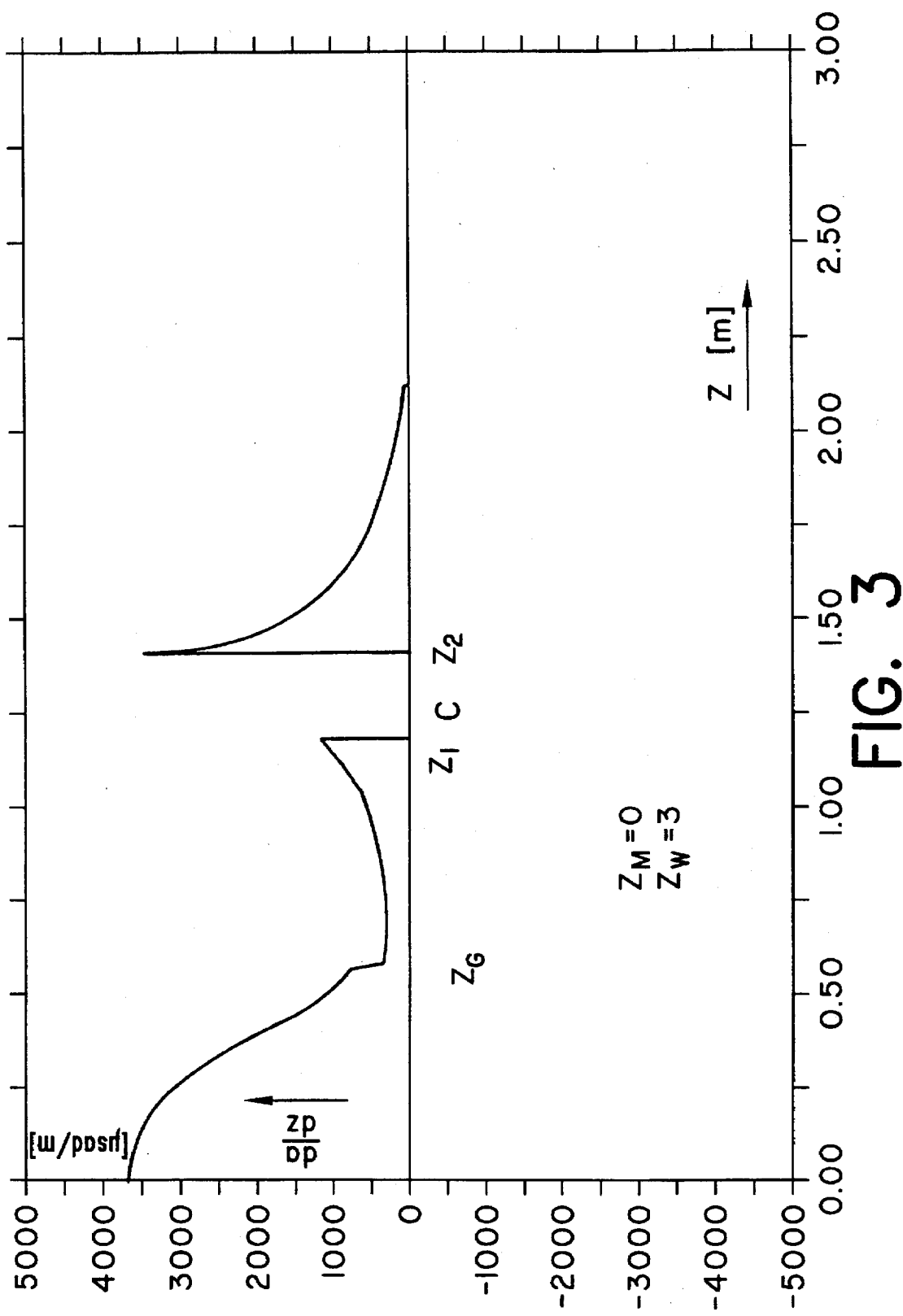

FIG. 3 illustrates the function $d\alpha/dz$. In the region between the diaphragms whose coordinates are $Z_1$ and $Z_2$, the value of this function is set to zero. The grating of the three electrode grating lenses is located at the location $Z_G$.

Figure 4:
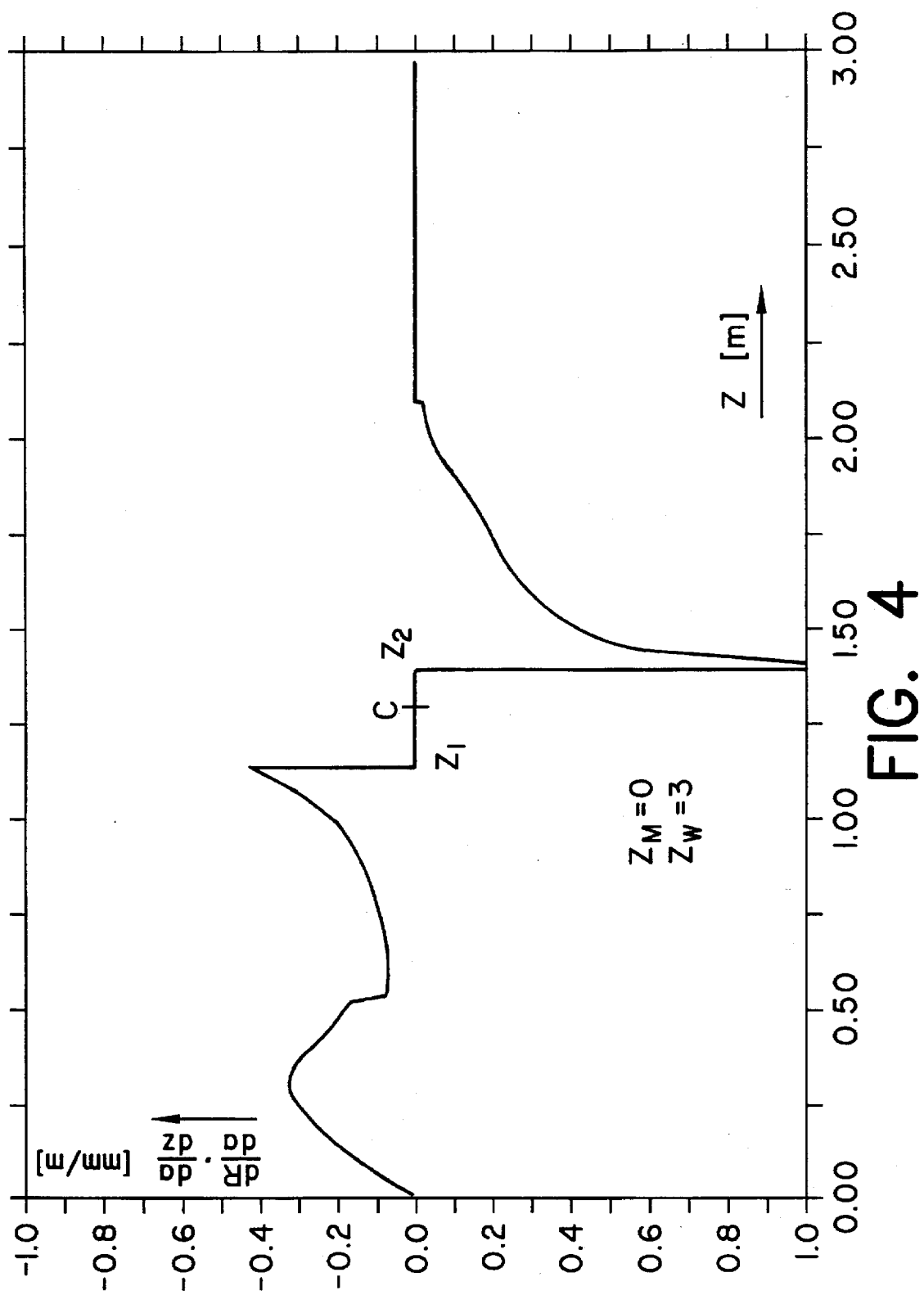

FIG. 4 illustrates the graph of the product $(dR/d\alpha)\cdot(d\alpha/dz)$.

Finally, FIG. 5 illustrates the integral for $\Delta R$.

It is evident that after the cross-over C the effect of the space charge reduces, i.e. a partial compensation of the space charge effect occurs irrespective of oppositely charged particles being provided. By providing a sufficient quantity of oppositely charged particles precisely in the region between $Z_1$ and $Z_2$, the effect of the space charge on the beam position becomes exactly equal to 0 at the location of the wafer (where z=3m).

Figure 6A:
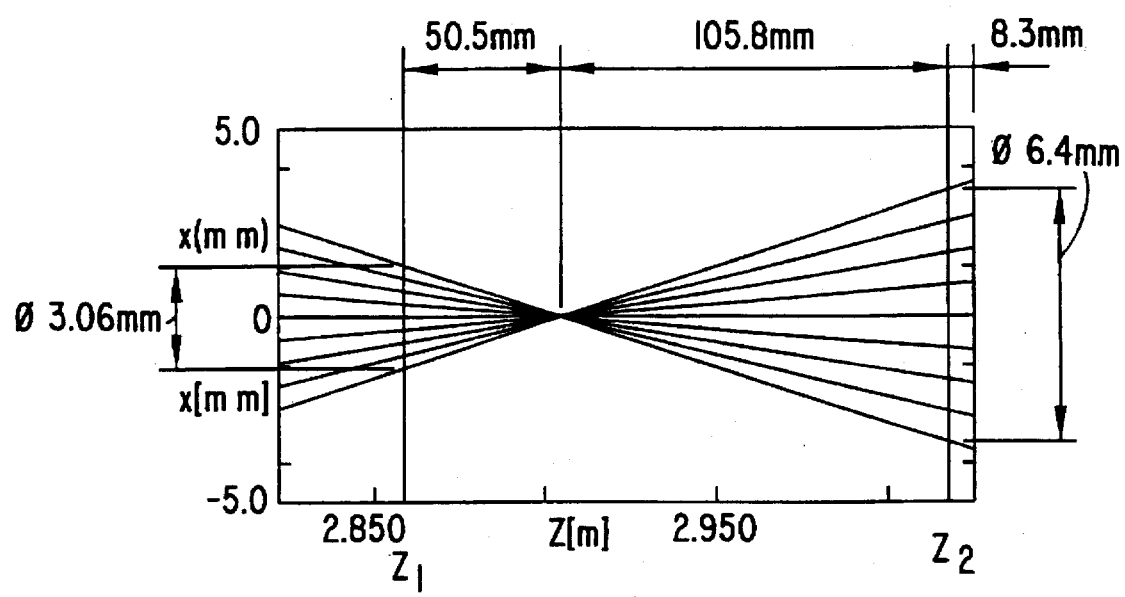
Figure 6B:
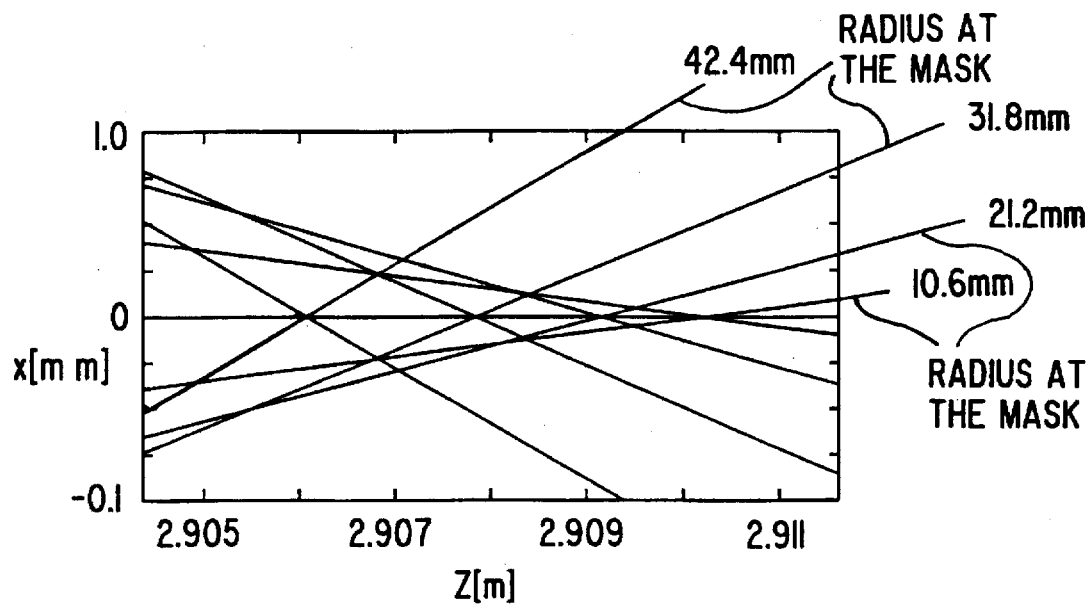

FIGS. 6a and 6b are based on an ion projector comprising a so-called two electrode grating lens, wherein the grating is formed by the mask (see Austrian patent application A47/94 of the same applicant and identical date). FIG. 6a shows calculated ion paths in the environment of the cross-over with the neutralising limits $Z_1$, $Z_2$. If diaphragms are provided at these locations, between which electrons are directed in sufficient numbers, then $\Delta R$ in the equation (3) becomes zero. FIG. 6b represents a greatly enlarged portion of FIG. 6a, from which it is evident that beams having different radii cross at the mask at different locations on the optical axis. FIG. 6b illustrates the region approximately 7 mm long, whereas FIG. 6a shows that the distance of the first diaphragm from the cross-over is greater than 50 mm. Thus, the assumption leading to equation (3) is sufficiently well fulfilled for the ions entering in the neutralising region at $Z_r$.

What is claimed is:

1. A projection system for charged particles having a mask which is disposed in a beam path of the charged particles and which comprises transparent portions including holes, which are disposed in a particularly asymmetrical manner with respect to an optical axis and which are imaged onto a wafer using lenses disposed in a beam path of the charged particles, wherein the beam of the charged particles includes at least one crossover between the mask and the wafer for crossing the optical axis, characterized in that in a defined region between the mask and the wafer, charged particles which are oppositely charged to the charge of the imaging particles are directed into the beam path of the imaging particles, wherein limits defining the region are selected such that an absolute amount of an integral effect of a space charge on the particles imaging the mask structures is identical in size before the defined region, as seen in the beam direction, as the absolute amount of the integral effect of the space charge after the defined region.

2. The projection system according to claim 1, characterized in that the imaging particles are positively charged ions and the oppositely charged particles are electrons.

3. The projection system according to claim 1, characterized in that the imaging particles are negatively charged ions, more specifically negative H-ions and the oppositely charged particles are positively charged ions.

4. The projection system according to claim 1, characterized in that a dispensing device for the particles which are charged oppositely to the imaging particles is a LaB6 cathode which is designed as a LaB6 cylinder indirectly heated and encompassing the beam.

5. The projection system according to claim 1, characterized in that a dispensing device for the particles which are charged oppositely to the imaging particles is an electron cannon which emits in particular 1 keV electrons through a hole onto the inner wall of a metal cylindrical screen which encompasses the beam, generating low energy secondary electrons which neutralize the beam.

6. The projection system according to claim 1, characterized in that the imaging particles are electrons and the oppositely charged particles are positively charged ions.

7. The projection system according to claim 1, characterized in that the particles charged oppositely to the imaging particles are directed to the beam path of the imaging particles in a region around the cross-over.

8. The projection system according to claim 7, characterized in that the size of the region around the at least one cross-over is dimensioned such that outside this region for all paths of imaging particles, the ratio of the radial distances of the two respective paths remains constant from the optical axis along the optical axis within previously fixed error limits.

9. The projection system according to claim 1, characterized in that in order to minimize a residual effect of the space charge the refractive powers of the lenses can be readjusted in dependence upon the total current intensity.

10. The projection system according to claim 1, characterized in that in order to define the region in which neutralizing particles are directed at least one diaphragm connected to a voltage source is disposed respectively on each side of the region and the hole of the at least one diaphragm allows to pass through the beam of rays containing the image information originating from the transparent portions in the mask.

11. The projection system according to claim 1, characterized in that a plurality of diaphragms are disposed on both sides of the at least one cross-over and corresponding potentials of the plurality of diaphragms can be adjusted individually, whereby the defined region for provision of the charged particles can be varied.

12. The projection system according to claim 3, further comprising a plurality of diaphragms characterized in that the hole in at least one of the diaphragms which is closer to the at least one cross-over is smaller than the hole in another one of the plurality of diaphragm lying further away from the cross-over.

* * * * *